US012550597B2

(12) United States Patent
Zhu et al.

(10) Patent No.: US 12,550,597 B2
(45) Date of Patent: Feb. 10, 2026

(54) DISPLAY MODULE AND DISPLAY DEVICE (71) Applicants: Yunnan Invensight Optoelectronics Technology Co., Ltd., Yunnan (CN); BOE Technology Group Co., Ltd., Beijing (CN)

(72) Inventors: Zhijian Zhu, Beijing (CN); Pengcheng Lu, Beijing (CN); Shengji Yang, Beijing (CN); Kuanta Huang, Beijing (CN); Xiaochuan Chen, Beijing (CN); Qian Wu, Beijing (CN); Longfei Fan, Beijing (CN); Dacheng Zhang, Beijing (CN)

(73) Assignees: Yunnan Invensight Optoelectronics Technology Co., Ltd., Yunnan (CN); BOE Technology Group Co., Ltd., Beijig (CN)

( * ) Notice: Subject to any disclaimer, the term of this patent is extended or adjusted under 35 U.S.C. 154(b) by 403 days.

(21) Appl. No.: 18/261,116

(22) PCT Filed: Sep. 7, 2022

(86) PCT No.: PCT/CN2022/117574
§ 371 (c)(1),
(2) Date: Jul. 12, 2023

(87) PCT Pub. No.: WO2023/065871
PCT Pub. Date: Apr. 27, 2023

(65) Prior Publication Data
US 2024/0074294 A1    Feb. 29, 2024

(51) Int. Cl.
*H10K 59/80* (2023.01)
*H10K 59/12* (2023.01)
(Continued)

(52) U.S. Cl.
CPC ........... *H10K 59/879* (2023.02); *H10K 59/35* (2023.02); *H10K 59/38* (2023.02); *H10K 59/875* (2023.02)

(58) Field of Classification Search
CPC ............................. H10K 59/38; H10K 59/879
See application file for complete search history.

(56) References Cited

U.S. PATENT DOCUMENTS 9,774,011 B2    9/2017   Choi et al.
2012/0223873 A1  9/2012   Ohta
(Continued)

FOREIGN PATENT DOCUMENTS

CN    104167420 A    11/2014
CN    108169921 A    6/2018
(Continued)

OTHER PUBLICATIONS

Extended European Search Report of application No. 22882486.8 dated Jan. 2, 2025.
(Continued)

*Primary Examiner* — Mariceli Santiago
(74) *Attorney, Agent, or Firm* — Calfee, Halter & Griswold LLP (57) ABSTRACT A display module, including: a display panel; and a color film layer and a micro-lens layer, provided on a light-emitting side of the display panel; where, the color film layer includes a plurality of filter portions, and the micro-lens layer includes a plurality of first converging lenses and a plurality of second converging lenses; a gap is provided between two adjacent first converging lenses, and an orthographic projection of a first converging lens on the display panel is located within an orthographic projection of a filter portion on the display panel; a second converging lens is provided in the gap between two adjacent first converging (Continued)

lenses, and a vertex of the second converging lens is located between a vertex of the first converging lens and a bottom surface of the first converging lens.

20 Claims, 5 Drawing Sheets

(51) Int. Cl.
  *H10K 59/35* (2023.01)
  *H10K 59/38* (2023.01)

(56) References Cited

U.S. PATENT DOCUMENTS

| | | |
|---|---|---|
| 2014/0339606 A1 | 11/2014 | Lin et al. |
| 2019/0103442 A1 | 4/2019 | Choi et al. |
| 2020/0251689 A1 | 8/2020 | Pan et al. |
| 2021/0132261 A1 | 5/2021 | Wang et al. |
| 2024/0381745 A1* | 11/2024 | Ikeda ............... H10K 59/40 |
| 2025/0057026 A1* | 2/2025 | Kim ............... H10K 59/8792 |
| 2025/0098493 A1* | 3/2025 | Yang ............... H10K 50/858 |
| 2025/0248287 A1* | 7/2025 | Tanaka ............... H10K 50/10 |

FOREIGN PATENT DOCUMENTS

| | | | |
|---|---|---|---|
| CN | 110603579 A | 12/2019 | |
| CN | 110634415 A | 12/2019 | |
| CN | 110764169 A | 2/2020 | |
| CN | 110783367 A | 2/2020 | |
| CN | 111682122 A | 9/2020 | |
| CN | 112054131 A | 12/2020 | |
| CN | 113241354 A | 8/2021 | |
| CN | 117042532 A * | 11/2023 | ............. H10K 59/38 |
| JP | 2000241809 A | 9/2000 | |
| JP | 2004070283 A | 3/2004 | |
| JP | 2006323149 A | 11/2006 | |
| JP | 2011013411 A | 1/2011 | |
| WO | 2019127709 A1 | 7/2019 | |

OTHER PUBLICATIONS

Written Opinion from PCT/CN2022/117574 dated Nov. 16, 2022.
International Search Report from PCT/CN2022/117574 dated Nov. 16, 2022.
Written Opinion from PCT/CN2022/12542 dated May 26, 2022.
International Search Report from PCT/CN2022/12542 dated May 26, 2022.

* cited by examiner

DISPLAY MODULE AND DISPLAY DEVICE

CROSS REFERENCE

The present disclosure is a National Stage of International Application No. PCT/CN2022/117574 filed on Sep. 7, 2022, and claims priority to International Patent Application No. PCT/CN2021/125420 entitled "Display module and preparation method therefor, and display device", filed on Oct. 21, 2021, the entire content of both of which is incorporated herein by reference.

TECHNICAL FIELD

The present disclosure relates to the field of display technology, and particularly, to a display panel and a display device including the display module.

BACKGROUND

A Micro-OLED (Micro-Organic Light-Emitting Diode) display has the advantages of small volume, light weight, high contrast, fast response speed, low power consumption and the like. However, the Micro-OLED display generally has the problem of low luminous brightness, thereby limiting the wide application of the Micro-OLED display in various fields.

It should be noted that the information disclosed in the above background part is only used to enhance the understanding of the background of the present disclosure, and therefore may include information that does not constitute related art known to those ordinary skilled in the art.

SUMMARY

According to an aspect of the present disclosure, there is provided a display module, including:
- a display panel;
- a color film layer and a micro-lens layer, provided on a light-emitting side of the display panel; where, the color film layer includes a plurality of filter portions, and the micro-lens layer includes a plurality of first converging lenses and a plurality of second converging lenses; a gap is provided between two adjacent first converging lenses, and an orthographic projection of a first converging lens on the display panel is located within an orthographic projection of a filter portion on the display panel; a second converging lens is provided in the gap between two adjacent first converging lenses, and a vertex of the second converging lens is located between a vertex of the first converging lens and a bottom surface of the first converging lens.

In at least one embodiment of the present disclosure, an overlapping portion is provided between two adjacent filter portions, and an orthographic projection of the overlapping portion on the display panel overlaps with an orthographic projection of the second converging lens on the display panel.

In at least one embodiment of the present disclosure, the first converging lens and the second converging lens protrude towards a side close to the display panel.

In at least one embodiment of the present disclosure, the display module further includes:
- a first planarization layer, provided between the display panel and the micro-lens layer; where, a refractive index of the first planarization layer is less than a refractive index of the micro-lens layer, a first recessed portion and a second recessed portion are provided on the first planarization layer, a portion of the micro-lens layer provided in the first recessed portion forms the first converging lens, and a portion of the micro-lens layer provided in the second recessed portion forms the second converging lens.

In at least one embodiment of the present disclosure, the bottom surface of the first converging lens protrudes from a bottom surface of the second converging lens, so that a groove is formed between two adjacent first converging lenses, and at least part of the overlapping portion is located within the groove.

In at least one embodiment of the present disclosure, on a section perpendicular to the display panel, an orthographic projection of a lowest point of the overlapping portion close to the display panel on the display panel is located within an orthographic projection of the second converging lens on the display panel.

In at least one embodiment of the present disclosure, the first converging lens and the second converging lens protrude towards a side away from the display panel.

In at least one embodiment of the present disclosure, on a section perpendicular to the display panel, an orthographic projection of a highest point of the overlapping portion away from the display panel on the display panel is located within an orthographic projection of the second converging lens on the display panel.

In at least one embodiment of the present disclosure, the micro-lens layer further includes:
- a first flat plate layer, provided on a side of the first converging lens close to the display panel;
- a second flat plate layer, provided on a side of the second converging lens close to the display panel, the second flat plate layer being integrally connected to the first flat plate layer.

In at least one embodiment of the present disclosure, the first converging lens and the second converging lens satisfies a relationship of:

$$D-d=(P-s)/2,$$

where, P is a width of the filter portion in a first direction, s is a width of the gap in the first direction, D is a sum of a height of the first converging lens and a height of the first flat plate layer, and d is a sum of a height of the second converging lens and a height of the second flat plate layer.

In at least one embodiment of the present disclosure, a thickness and a refractive index of each film layer between a light-emitting surface of the display panel and the micro-lens layer satisfy a relationship of:

$$L=\Sigma L_i n_i \approx (P-s)/[2\times(n-1)],$$

where, L is an optical path between the light-emitting surface of the display panel and a surface of the micro-lens layer close to the display panel, n is a refractive index of the first converging lens, $L_i$ is the thickness of each film layer between the light-emitting surface of the display panel and the micro-lens layer, and $n_i$ is the refractive index of each film layer between the light-emitting surface of the display panel and the micro-lens layer.

In at least one embodiment of the present disclosure, a width of the second converging lens is less than 1/10 of a width of the first converging lens, and a height of the second converging lens is less than 1/10 of a height of the first converging lens.

In at least one embodiment of the present disclosure, the display panel includes:

a substrate layer;

a first electrode, provided between the substrate layer and the color film layer;

a light-emitting layer, provided on a side of the first electrode away from the substrate layer;

a second electrode, provided on a side of the light-emitting layer away from the substrate layer;

where, an orthographic projection of the second converging lens on the substrate layer is at least partially located within a projection of an edge portion of the first electrode on the substrate layer.

In at least one embodiment of the present disclosure, the second electrode includes a flat portion and a concave portion, and the orthographic projection of the second converging lens on the substrate layer is located within a projection of the concave portion on the substrate layer.

In at least one embodiment of the present disclosure, a width of the first converging lens is greater than a maximum width of the first electrode.

In at least one embodiment of the present disclosure, a height of the second converging lens is less than a distance between two adjacent first electrodes.

In at least one embodiment of the present disclosure, an orthographic projection of the first converging lens on the substrate layer is located within an orthographic projection of the light-emitting layer on the substrate layer.

In at least one embodiment of the present disclosure, the first converging lens is configured as a spherical segment structure, and the second converging lens is configured as a spherical segment structure.

In at least one embodiment of the present disclosure, the micro-lens layer is located on a side of the color film layer away from the display panel, or the micro-lens layer is located on a side of the color film layer close to the display panel.

According to another aspect of the present disclosure, there is provided a display device, including any one of the display modules described above.

It should be understood that the above general description and the following detailed description are exemplary and explanatory only and are not intended to limit the present disclosure.

BRIEF DESCRIPTION OF THE DRAWINGS

The accompanying drawings, which are incorporated in and constitute a part of this description, illustrate embodiments consistent with the present disclosure and, together with the description, serve to explain the principles of the present disclosure. In an obvious way, the accompanying drawings in the following description are merely some embodiments of the present disclosure, and for those of ordinary skills in the art, other drawings may be obtained according to these drawings without involving any inventive effort.

DESCRIPTION OF THE REFERENCE NUMBERS

1. Display panel; 11. Substrate layer; 12. Backplate; 13. Third planarization layer; 14. First electrode; 141. Metal layer; 142. Transparent conductive layer; 143. Edge portion; 15. Pixel dielectric layer; 16. Light-emitting layer; 17. Second electrode; 171. Flat portion; 172. Concave portion; 18. Light-emitting unit;
2. Thin film encapsulation;
3. First planarization layer; 31. First recess portion; 32. Second recess portion;
4. Color film layer; 41. Red filter portion; 42. Green filter portion; 43. Blue filter portion; 44. Overlapping portion; 4a. Filter portion;
5. Second planarization layer;
6. Micro-lens layer; 61. First converging lens; 62. Second converging lens; 63. First flat plate layer; 64. Second flat plate layer; 65. Gap; 66. Groove;
7. Adhesive layer; 8. Cover plate.

DETAILED DESCRIPTION

Example embodiments will now be described more fully with reference to the accompanying drawings. However, the example embodiments can be implemented in various forms and should not be construed as limited to the embodiments set forth herein; by contrast, these embodiments are provided so that present disclosure will be thorough and complete, and will fully convey the concepts of the example embodiments to those skilled in the art. The same reference numbers in the drawings denote the same or similar structures, and thus their detailed description will be omitted. In addition, the drawings are merely schematic illustrations of the present disclosure, and are not necessarily drawn to scale.

Although relative terms such as "upper" and "lower" are used in the description to describe the relative relationship of one component to another component shown in the drawings, these terms are used in the description only for convenience, for example, according to the directions shown in the accompanying drawings. It will be appreciated that if the device shown in the drawings is turned over so that it is upside down, then component described as being "upper" will become the component that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate an open inclusion and means that there may be additional elements/components/etc. in addition to the listed elements/components/etc.; the terms "first", "second" and "third" etc. are only used as a marker, not a limit on the number of its objects.

An example embodiment of the present disclosure provides a display module. Referring to FIG. 1 to FIG. 6, the display module may include a display panel 1, a color film layer 4, and a micro-lens layer 6; the color film layer 4 and the micro-lens layer 6 are provided on the light-emitting side of the display panel 1, and the color film layer 4 includes a plurality of filter portions 4a; the micro-lens layer 6 includes a plurality of first converging lenses 61 and a plurality of second converging lenses 62, a gap 65 is provided between two adjacent first converging lenses, and an orthographic projection of a first converging lens on the display panel 1 is located within an orthographic projection of a filter portion 4a on the display panel 1; a second converging lens 62 is provided in the gap 65 between two adjacent first converging lenses 61, and the vertex of the second converging lens 62 is located between the vertex of the first converging lens 61 and the bottom surface of the first converging lens 61.

According to the display module of the present disclosure, the first converging lens may converge the light emitted from the filter portion 4a, so that the diffusion angle of the light emitted from the first converging lens is smaller, thereby improving the display brightness within the effective viewing angle. When the gap 65 is provided between two adjacent first converging lenses 61, the preparing process of the first converging lens 61 can make the appearance of the first converging lens 61 more standard, thereby ensuring the convergence effect on the light, further improving the brightness. After a plurality of tests, the brightness improvement multiple is about 1.4 to 1.6. The second converging lens 62 may converge the light incident into the gap 65 between the two adjacent first converging lenses 61, thereby further improving the brightness of the display module. Furthermore, the vertex of the second converging lens is located between the vertex of the first converging lens and the bottom surface of the first converging lens, so that the light that is not incident to the first converging lens may be incident to the second converging lens, and the second converging lens may converge the light, thereby reducing light crosstalk.

It should be noted that both the first converging lens 61 and the second converging lens 62 are configured as protruding structures. The first converging lens 61 has a bottom surface and a vertex provided opposite to each other, and the first converging lens 61 is configured to be of a structure that is gradually reduced from the bottom surface to the vertex. The second converging lens 62 also has a bottom surface and a vertex provided opposite to each other, and the second converging lens 62 is also configured to be a structure that is gradually reduced from the bottom surface to the vertex. The bottom surface of the first converging lens 61 refers to a surface with the largest area, and the vertex of the first converging lens 61 refers to a point having the maximum distance from the bottom surface of the first converging lens 61. The bottom surface of the second converging lens 62 refers to a surface with the largest area, and the vertex of the second converging lens 62 refers to a point having the maximum distance from the bottom surface of the second converging lens 62.

Figure 1:
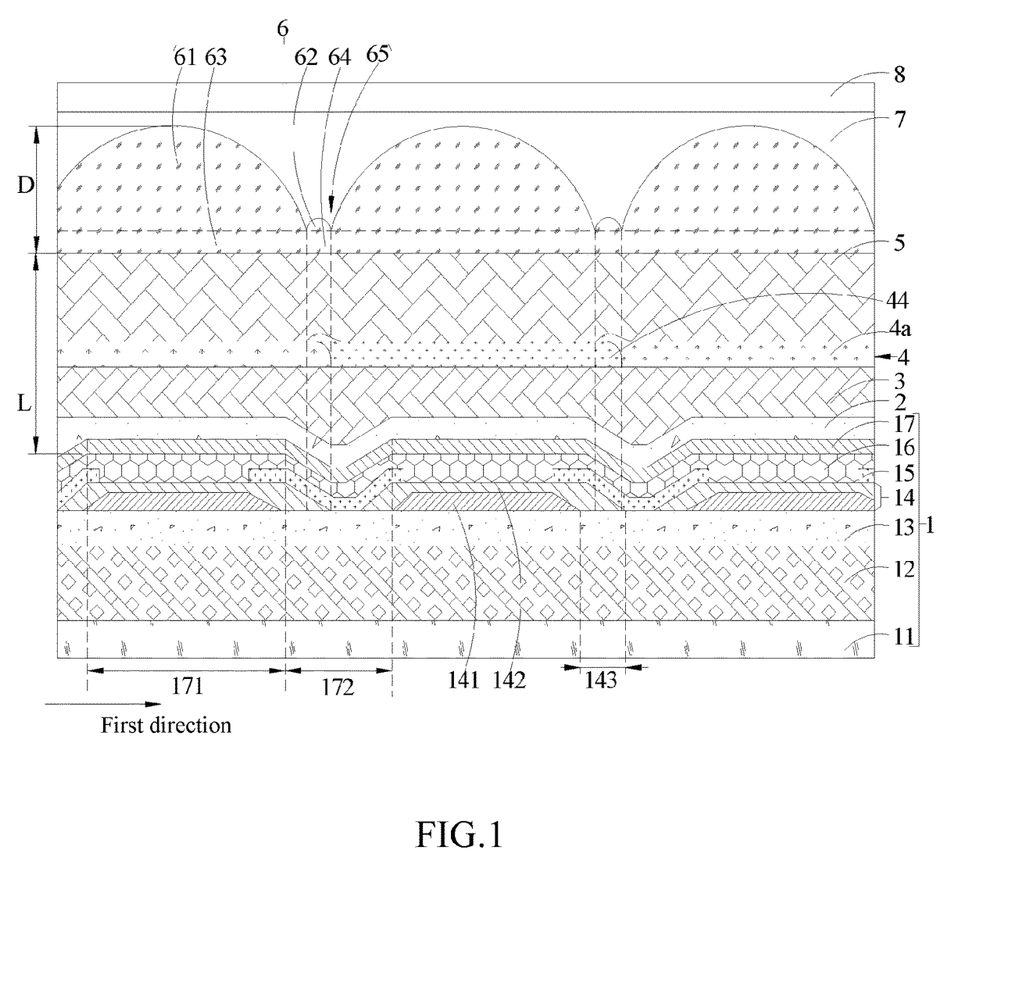
FIG. 1 is a schematic structural diagram of a display module according to some embodiments of the present disclosure.

In this example embodiment, referring to FIG. 1, the display panel 1 may include a substrate layer 11, and the substrate layer 11 may be a wafer, sapphire, or the like. A backplate 12 is provided on a side of the substrate layer 11, and the backplate 12 includes a plurality of switch structures arranged in an array. The switch structure may include a gate, a source, a drain, and the like. That is, a monocrystalline silicon integrated circuit is used as the backplate. A third planarization layer 13 is provided on the side of the backplate 12 away from the substrate layer 11, and the third planarization layer 13 may provide a relatively flat base plane for a first electrode 14 and a light-emitting layer 16 formed subsequently, which is beneficial to the light-emitting effect of the light-emitting layer 16.

The first electrode 14 is provided on a side of the third planarization layer 13 away from the substrate layer 11, and the first electrode 14 is electrically connected to a source or a drain in the switch structure. The first electrode 14 is configured as a two-layer structure, one layer close to the third planarization layer 13 is a metal layer 141, the material of which may be titanium, silver, and the like; and one layer away from the third planarization layer 13 is a transparent conductive layer 142, the material of which may be ITO (Indium Tin Oxide), IZO (Indium Zinc Oxide), and the like. The transparent conductive layer 142 completely covers the metal layer 141, so that an edge portion 143 of the transparent conductive layer 142 protrudes from the metal layer 141, and the edge portion 143 of the transparent conductive layer 142 forms the edge portion 143 of the first electrode 14.

The width of the first converging lens 61 is greater than the maximum width of the first electrode 14. For example, in the condition that the first electrode 14 is a regular hexagon, the maximum width of the first electrode 14 is the length of the diagonal line of two opposite corners of the regular hexagon; and in the condition that the first electrode 14 is a rectangle, the maximum width of the first electrode 14 is the length of the diagonal line of the rectangle. A spacing space is provided between two adjacent first electrodes 14, and the width of the spacing space in a first direction is a distance between two adjacent first electrodes 14.

A pixel dielectric layer 15 is provided on a side of the first electrode 14 away from the substrate layer 11. A first via hole is provided on the pixel dielectric layer 15, and the first via hole causes the first electrode 14 to be partially exposed. The light-emitting layer 16 is provided on the side of the pixel dielectric layer 15 away from the substrate layer 11 and in the first via hole. The light-emitting layer 16 is provided in a whole layer and completely covers the pixel dielectric layer 15 and the first electrode 14, and the light-emitting layer 16 is connected to the first electrode 14. The orthographic projection of the first converging lens 61 on the substrate layer 11 is located within the orthographic projection of the light-emitting layer 16 on the substrate layer 11.

A second electrode 17 is provided on a side of the light-emitting layer 16 away from the substrate layer 11, and the second electrode 17 is also connected to the light-emitting layer 16. The second electrode 17 includes a flat portion 171 and a concave portion 172. The portion of the second electrode 17 opposite to the metal layer 141 of the first electrode 14, since the height of this portion of the first electrode 14 is substantially unchanged, forms the flat part 171 of the second electrode 17. For the portion of the second electrode 17 opposite to the edge portion 143 of the first electrode 14, since the height of the edge portion 143 of the first electrode 14 gradually decreases, the second electrode 17 is gradually concaved to form a concave portion 172. The lowest position of the concave portion 172 is formed at a position opposite to the spacing space between two adjacent first electrodes 14.

The first electrode 14, the light-emitting layer 16, and the second electrode 17 form a light-emitting structure. The light-emitting layer 16 in one via hole forms a light-emitting unit 18, that is, the light-emitting structure includes a light-emitting unit 18. The light-emitting unit 18 can be driven and controlled through the switch structure.

Figure 3:
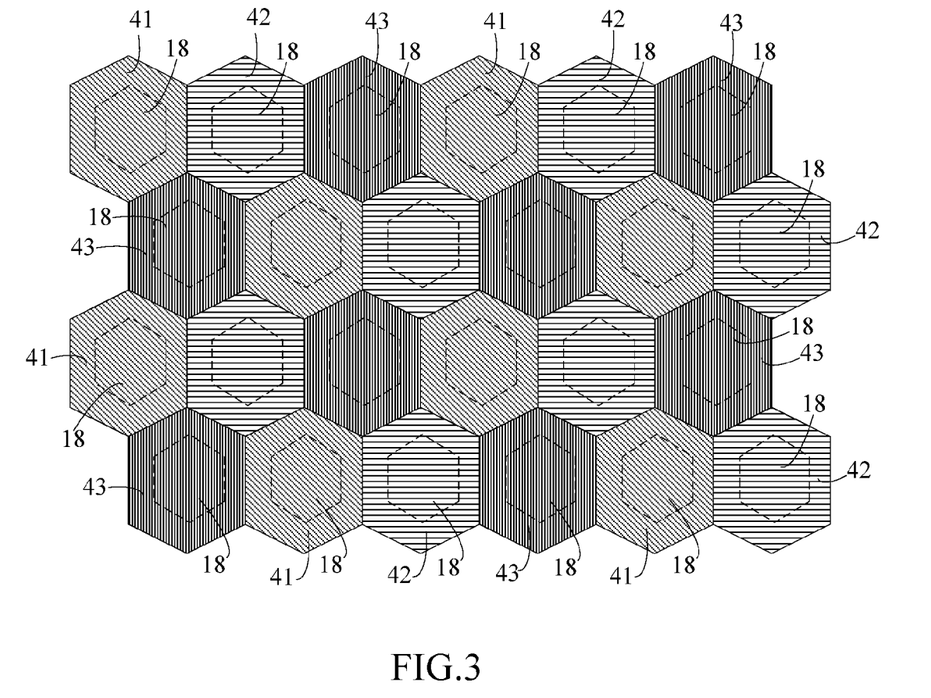
FIG. 3 is a schematic diagram of a relative position of the color film layer and the light-emitting unit in FIG. 1.
Figure 4:
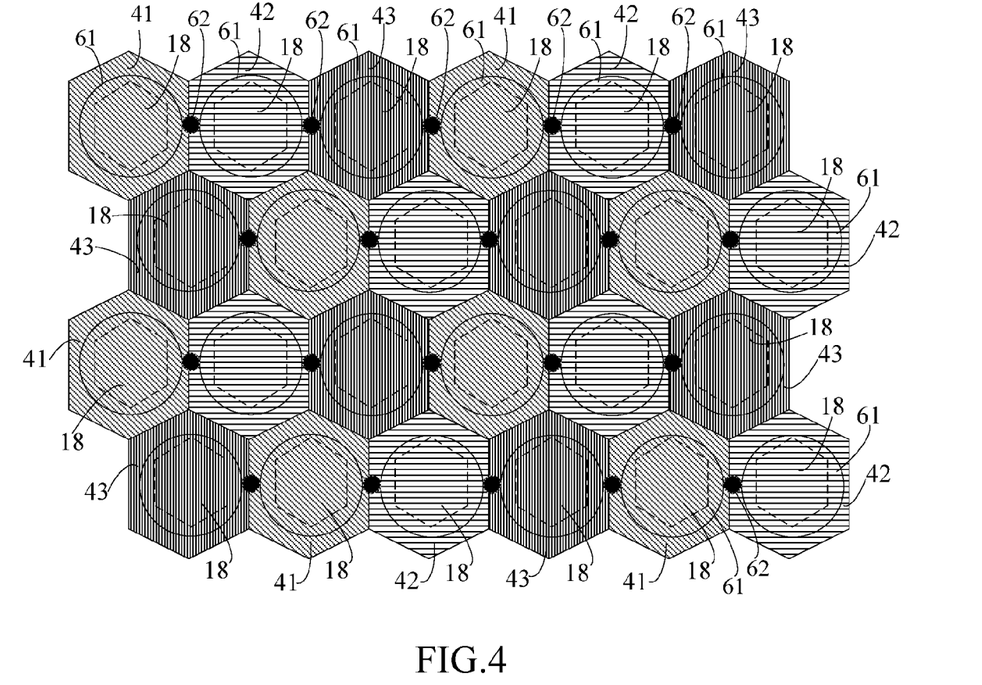
FIG. 4 is a schematic diagram of the relative position of the micro-lens layer, the color film layer and the light-emitting unit in FIG. 1.

In this example embodiment, referring to FIG. 3, a section of the first via hole parallel to the substrate layer 11 may be configured as a regular hexagon, and a section of the light-emitting unit 18 parallel to the substrate layer 11 may be configured as a regular hexagon. In other example embodiments of the present disclosure, the section of the first via hole parallel to the substrate layer 11 may be configured to be rectangular, circular, other regular polygons, and the like, and the section of the corresponding light-emitting unit 18 parallel to the substrate layer 11 may be configured to be rectangular, circular, other regular polygons, and the like.

The first electrode 14 may be an anode, and the second electrode 17 may be a cathode. The material of the first electrode 14 may be a conductive material including ITO (Indium Tin Oxide), IZO (Indium Zinc Oxide), and the like, and the material of the second electrode 17 may be Mg, Ag, and the like.

Continuing to refer to FIG. 1, a TFE 2 (Thin Film Encapsulation) is provided on the side of the second electrode 17 away from the substrate layer 11. Since the material of the light-emitting layer 16 and the material of the cathode are relatively sensitive to water (H2O) and oxygen (O2), they are easy to oxidize. The effect of isolating water and oxygen can be achieved through the TFE 2, so as to protect the display panel 1. The TFE 2 may include an inorganic material layer and an organic material layer, and each film layer has good compactness. The number of the inorganic material layers, the number of the organic material layers and the relative positional relationships may be set according to requirements.

In this example embodiment, a first planarization layer 3 may be provided on the light-emitting side of the display panel 1, that is, the first planarization layer 3 may be provided on the side of the TFE 2 away from the substrate layer 11. The color film layer 4 is provided on the side of the first planarization layer 3 away from the display panel 1, that is, the first planarization layer 3 is provided between the display panel 1 and the color film layer 4. The first planarization layer 3 provides a relatively flatter base surface for the color film layer 4, so that the formed color film layer 4 is flatter; and the first planarization layer 3 can increase the adhesion between the color film layer 4 and the display panel 1. In some other example embodiments of the present disclosure, the first planarization layer 3 may not be provided in the condition that the flatness of the TFE 2 is better.

Figure 2:
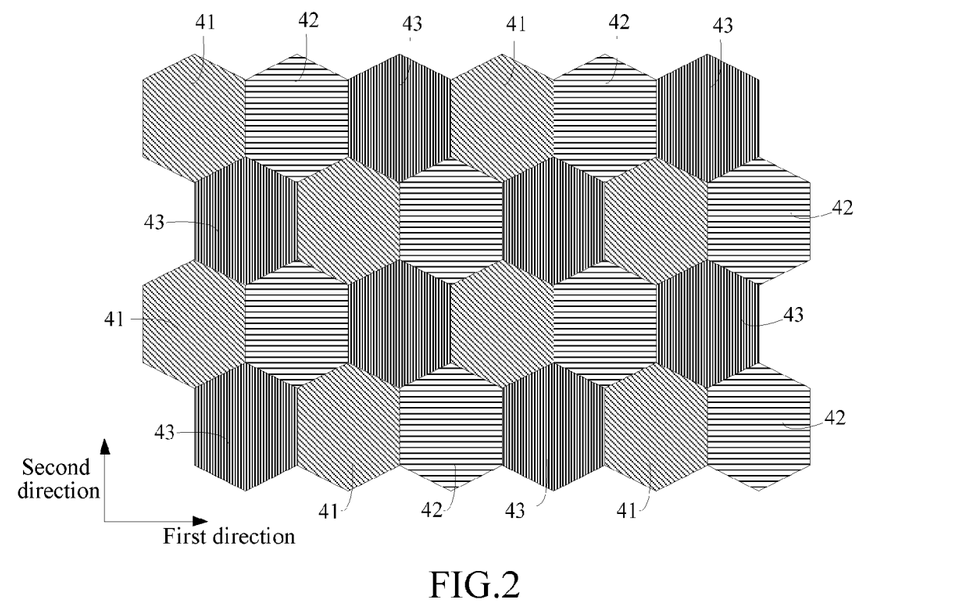
FIG. 2 is a schematic top view of the color film layer in FIG. 1.

In this example embodiment, referring to FIG. 1 and FIG. 2, the color film layer 4 may include a plurality of filter portions 4a, and the plurality of filter portions 4a may include a plurality of red filter portions 41, a plurality of green filter portions 42, and a plurality of blue filter portions 43. An overlapping portion 44 is provided between two adjacent filter portions 4a. For example, it may be that the edge portion of a red filter portion 41 overlaps on the edge portion of a green filter portion 42, or the edge portion of the green filter portion 42 overlaps on the edge portion of a blue filter portion 43. The portion where they overlap with each other forms an overlapping portion 44.

Referring to FIG. 2, the filter portion 4a may also be configured as a regular hexagon, so that the plurality of filter portions 4a may be densely distributed on the side of the first planarization layer 3 away from the display panel 1. For example, in a first direction, the red filter portion 41, the green filter portion 42, and the blue filter portion 43 are sequentially arranged and circularly provided to form a row. The foregoing row of filter portions are sequentially arranged in a second direction, and two adjacent rows are provided in a staggered manner, so that the plurality of filter portions can be densely distributed and provided. The first direction and the second direction are perpendicular to each other. In other example embodiments of the present disclosure, the section of the filter portion parallel to the substrate layer 11 may be configured to be rectangular, circular, other regular polygons, and the like.

Referring to FIG. 3, the filter portion and the light-emitting unit 18 are in one-to-one correspondence, that is, one filter portion corresponds to one light-emitting unit 18. The orthographic projection of the light-emitting unit 18 on the substrate layer 11 is located within the orthographic projection of the filter portion on the substrate layer 11, that is, the area of the filter portion is greater than the area of the light-emitting unit 18.

After filtering the light through the color film layer 4, each filter portion can have monochromatic red, blue, or green light passing through. That is, the light passing through the red filter portion 41 is red light, and the light of other colors can be absorbed by the red filter portion 41; the light passing through the blue filter portion 43 is blue light, and the light of other colors may be absorbed by the blue filter portion 43; and, the light passing through the green filter portion 42 is green light, and the light of other colors may be absorbed by the green filter portion 42. Therefore, the brightness of the light emitted by the light-emitting unit 18 can be greatly reduced after passing through the color film layer 4. For example, the transmittance of the color film layer 4 is $\tau$, the AR (aperture ratio) of the filter portion is $\alpha$, and the brightness of the white light emitted by the light-emitting unit 18 is L, then the brightness LCF that can be felt by human eyes, after passing through the color film layer 4, is $\tau \times \alpha \times L$. The transmittance of the color film layer 4 is about 18% to 30%, and the aperture ratio is about 60% to 70%. It can be seen through calculation that, on average, only about one quarter of the white light emitted by the light-emitting unit 18 is effectively utilized, resulting in a problem of lower brightness of the display module. However, in VR and AR fields, due to the factors such as low optical system efficiency, or outdoor use, and the like, they have much high requirements on the brightness of the Micro OLED microdisplay.

Continuing to refer to FIG. 1, in this example embodiment, a second planarization layer 5 may be provided on a side of the color film layer 4 away from the display panel 1, and the micro-lens layer 6 is provided on a side of the second planarization layer 5 away from the display panel 1. That is, the second planarization layer 5 may be provided between the color film layer 4 and the micro-lens layer 6. The second planarization layer 5 provides a relatively flatter base surface for the micro-lens layer 6, so that the formed micro-lens layer 6 is more standard, the light condensation effect is further improved, and the brightness of the display module is further improved. In some other example embodiments of the present disclosure, the second planarization layer 5 may not be provided.

Continuing to refer to FIG. 1, in some example embodiments of the present disclosure, the micro-lens layer 6 may include a plurality of first converging lenses 61. A gap 65 is provided between two adjacent first converging lenses 61, that is, there is no connection between two adjacent first converging lenses 61. The orthographic projection of a first converging lens 61 on the display panel 1 is located within the orthographic projection of a filter portion 4a on the display panel 1, that is, the first converging lens 61 and the filter portion 4a are in one-to-one correspondence. Furthermore, the first converging lens 61 may protrude towards the side away from the display panel 1. In some other example embodiments of the present disclosure, referring to FIG. 7 and FIG. 8, the first converging lens 61 may protrude towards the side close to the display panel 1.

The maximum area of the section of the first converging lens 61 parallel to the display panel 1 is less than or equal to the area of the filter portion 4a, that is, the bottom surface of the first converging lens 61 is less than or equal to the area of the filter portion 4a. The orthographic projection of the light-emitting unit 18 on the substrate layer 11 is located within the orthographic projection of the first converging lens 61 on the substrate layer 11, that is, the maximum area of the section of the first converging lens 61 parallel to the display panel 1 is greater than or equal to the area of the light-emitting unit 18.

Therefore, the light emitted from the filter portion 4a may be converged by the first converging lens 61, so that the diffusion angle of the light emitted from the first converging lens 61 is smaller, thereby improving the display brightness within the effective viewing angle. Moreover, in order to better converge light at a large angle, the first converging lens 61 should be made as large as possible. For example, the width of the first converging lens 61 may be greater than the maximum width of the first electrode 14, so that the larger first converging lens 61 may converge light within a larger angle range in the case of a certain height from the light-emitting unit 18. However, the preparing process of the first converging lens 61 determines that there needs to be a certain gap 65 between two adjacent first converging lenses 61, so as to ensure that the first converging lens 61 has a better appearance (which is beneficial to converging light). That is, when a gap 65 is provided between two adjacent first converging lenses 61, the preparing process of the first converging lens 61 makes the appearance of the first converging lens 61 more standard, thereby ensuring the convergence effect on light and further improving the brightness.

The first converging lens 61 may be configures as a hemispheroid. In other example embodiments of the present disclosure, the first converging lens 61 may also be configured to be more than a hemispheroid or less than a hemispheroid. The first converging lens 61 is configured to be a spherical segment structure, so that the light in various directions emitted from the filter portion 4a can be converged, thereby further improving the display brightness within the effective viewing angle.

In addition, in the case that the light-emitting unit 18 is a rectangle and the rectangle includes short edges with a shorter length and long edges with a longer length, in order to adapt to the light-emitting unit 18, the first converging lens 61 may be configured as a structure of a semi-ellipsoid, less than a semi-ellipsoid or more than a semi-ellipsoid, and it can also be achieved that the light in various directions emitted from the filter portion 4a are converged, thereby further improving the display brightness within the effective viewing angle. The first converging lens 61 may be configured as a structure of a semi-cylinder, more than a semi-cylinder, or less than a cylinder.

In this example embodiment, a second converging lens 62 is provided in the gap 65 between two adjacent first converging lenses 61, and the second converging lens 62 may also protrude towards the side away from the display panel 1. In some other example embodiments of the present disclosure, referring to FIG. 7 and FIG. 8, the second converging lens 62 may also protrude towards the side close to the display panel 1.

Since the gap 65 is provided between two adjacent first converging lenses 61, the light incident to the gap 65 between two adjacent first converging lenses 61 cannot be converged, and therefore, the improvement value of the brightness of the display module by the first converging lens 61 is not ideal enough. The light incident to the gap 65 between two adjacent first converging lenses 61 can be converged by the second converging lens 62, thereby further improving the brightness of the display module.

The width of the second converging lens 62 is less than $\frac{1}{10}$ of the width of the first converging lens 61, and the height of the second converging lens 62 is less than $\frac{1}{10}$ of the height of the first converging lens 61, such that the second converging lens 62 has a small volume relative to the first converging lens 61. The convergence of light is mainly achieved through the first converging lens 61, and the second converging lens 62 mainly plays an auxiliary role. The second converging lens 62 is configured to be small enough, so as to avoid the impact of the second converging lens 62 on the first converging lens 61, that is, to avoid the impact on the main light-emitting region.

Figure 5:
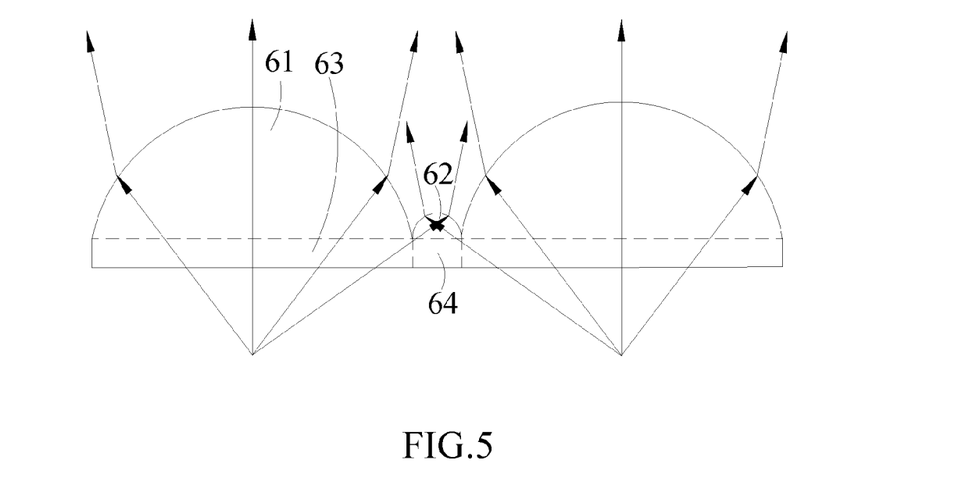
FIG. 5 is a schematic diagram of the optical path of the micro-lens layer in FIG. 1.
Figure 7:
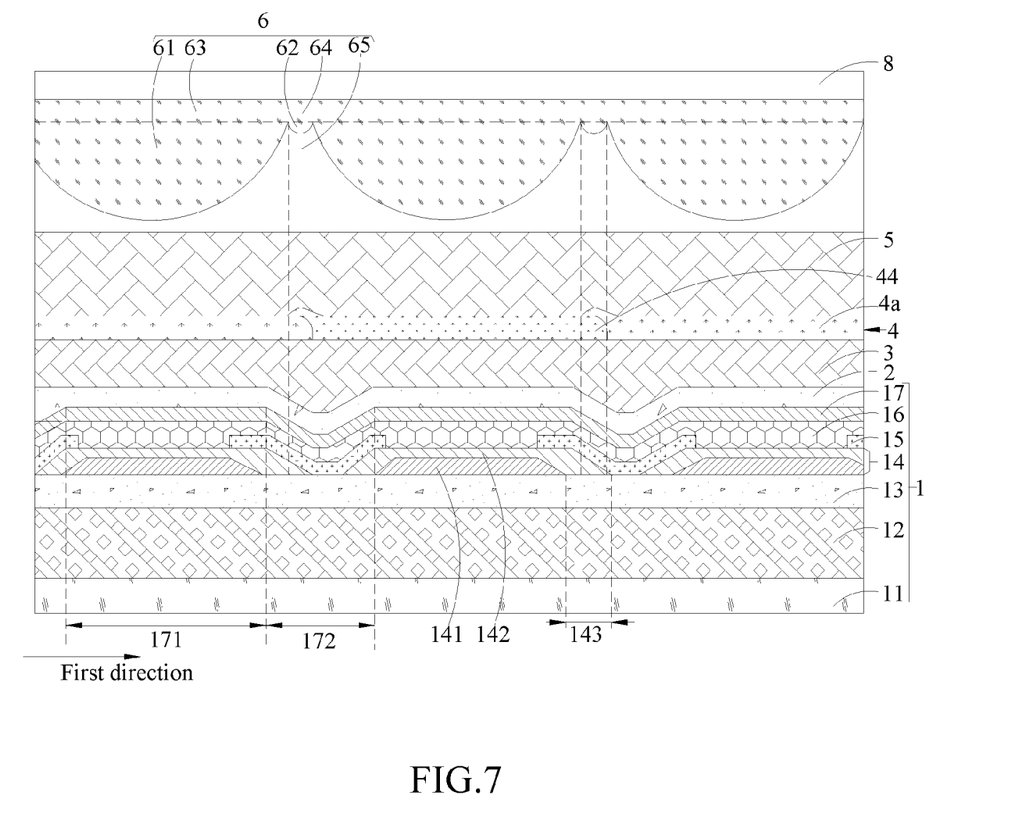
FIG. 7 is a schematic structural diagram of a display module according to some embodiments of the present disclosure.

Moreover, referring to FIG. 1 and FIG. 7, the orthographic projection of the overlapping portion 44 between two adjacent filter portions 4a on the display panel 1 overlaps with the orthographic projection of the second converging lens 62 on the display panel 1. For example, the red filter portion 41 and the green filter portion 42 are two adjacent filter portions, and the orthographic projection of the overlapping portion 44 of the red filter portion 41 and the green filter portion 42 on the display panel 1 overlaps with the orthographic projection of the second converging lens 62 on the display panel 1. Referring to FIG. 5, the second converging lens 62 may refract light of different colors emitted from the red filter portion 41 and the green filter portion 42, and refract the light emitted from the red filter portion 41 towards a side of the red filter portion 41, and refract the light emitted from the green filter portion 42 towards a side of the green filter portion 42, thereby reducing the color crosstalk between the red filter portion 41 and the green filter portion 42, and preventing color deviation from being generated at a large viewing angle. The filter portions of other colors have the same beneficial effects.

In addition, the highest point of the overlapping portion 44 away from the display panel 1 is generally located in the middle of the overlapping portion 44. On a section perpendicular to display panel 1, the orthographic projection of the highest point of the overlapping portion 44 away from the display panel 1 on the display panel 1 is located within the orthographic projection of the second converging lens 62 on the display panel 1, such that the second converging lens 62 is basically located in the middle of the overlapping portion 44. The refractive effect of the second converging lens 62 on the light emitted from two adjacent filter portions 4a is basically the same, and there will not be a larger refractive angle for one and a smaller refractive angle for the other, thereby avoiding poor color deviation.

Figure 8:
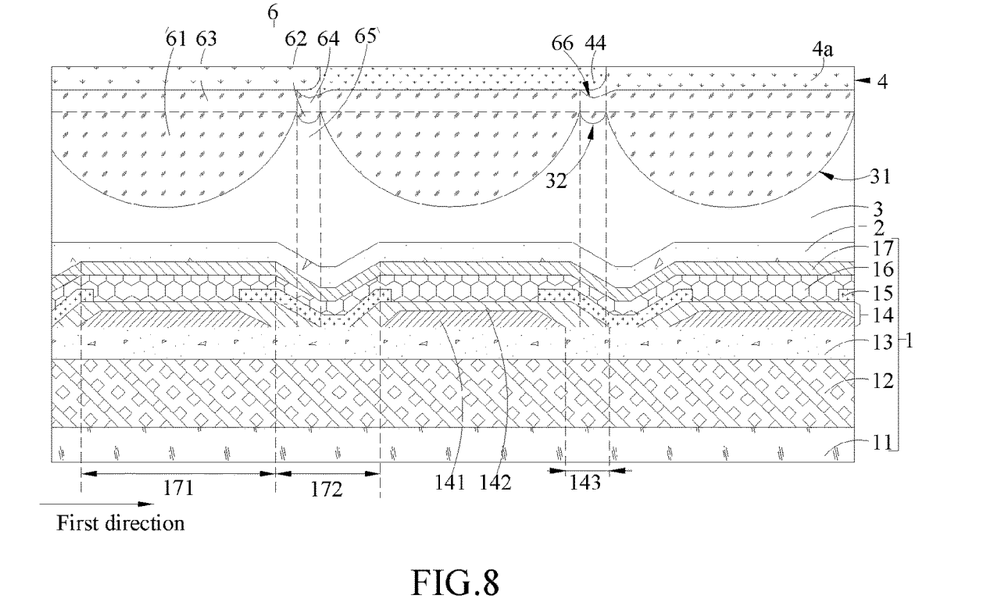
FIG. 8 is a schematic structural diagram of a display module according to some embodiments of the present disclosure.

As shown in FIG. 7 and FIG. 8, in the case that the first converging lens 61 protrudes towards the side close to the display panel 1 and the second converging lens 62 also protrudes towards the side close to the display panel 1, the lowest point of the overlapping portion 44 close to the display panel 1 is generally located in the middle of the overlapping portion 44. On a section perpendicular to display panel 1, the orthographic projection of the lowest point of the overlapping portion 44 close to the display panel 1 on the display panel 1 is located within the orthographic projection of the second converging lens 62 on the display panel 1.

Moreover, the overlapping portion 44 is optically opaque. For example, the light emitted from the green filter portion 42 is green light, and after passing through the red filter portion 41 overlapping with the green filter portion 41, since the green light may be completely absorbed by the red filter portion 41, so that no light is emitted from the red filter portion 41, and no light is emitted from the overlapping portion 44, thus the overlapping portion 44 is optically opaque. Then, the light emitted from the filter portion along the edge of the overlapping portion 44 forms an image of the overlapping portion 44, and the converging effect of the second converging lens 62 on the light causes the image of the overlapping portion 44 to be reduced, so that the area of the light-tight region incident into human eyes is reduced, thereby improving the aperture ratio of the display module.

In some other example embodiments of the present disclosure, the orthographic projection of the second converging lens 62 on the substrate layer 11 is at least partially located within the projection of the edge portion 143 of the first electrode 14 on the substrate layer 11, that is, the orthographic projection of the second converging lens 62 on the substrate layer 11 may be completely located within the projection of the edge portion 143 of the first electrode 14 on the substrate layer 11, or the orthographic projection of the second converging lens 62 on the substrate layer 11 may be partially located within the projection of the edge portion 143 of the first electrode 14 on the substrate layer 11. Therefore, the second converging lens 62 is located at the edge of the light-emitting unit 18, and the second converging lens 62 is prevented from affecting the light path of the first converging lens 61, that is, the effect on the main light-emitting region is avoided.

In some other example embodiments of the present disclosure, the orthographic projection of the second converging lens 62 on the substrate layer 11 is located within the projection of the concave portion 172 on the substrate layer 11. Therefore, the second converging lens 62 is located at the edge of the light-emitting unit 18, and the second converging lens 62 is prevented from affecting the light path of the first converging lens 61, that is, the effect on the main light-emitting region is avoided. Furthermore, the second converging lens 62 is basically located in the middle of two adjacent light-emitting units 18, and the second converging lens 62 has substantially the same refractive effect on light emitted from two adjacent light-emitting units 18, thereby avoiding poor color deviation.

In some other example embodiments of the present disclosure, the height of the second converging lens 62 is less than the distance between two adjacent first electrodes 14. Therefore, the second converging lens 62 is configured to be small enough to prevent the second converging lens 62 from affecting the first converging lens 61, that is, the effect on the main light-emitting region is avoided.

The second converging lens 62 may be configured as a hemispheroid. In other example embodiments of the present disclosure, the second converging lens 62 may also be configured to be more than a hemispheroid or less than a hemispheroid. The second converging lens 62 is configured as a spherical segment structure to converge the light in various directions emitted from the filter portion 4a, thereby further improving the display brightness within the effective viewing angle.

In addition, since the separation line between the two adjacent filter portions 4a is generally elongated, in order to adapt to the separation line, the second converging lens 62 may be configured as a structure of a semi-ellipsoid, less than a semi-ellipsoid or more than a semi-ellipsoid, which may also achieve the effect of converging the light emitted from the filter portion 4a in various directions, thereby further improving the effect of display brightness within the effective viewing angle. Furthermore, the color crosstalk between two adjacent filter portions 4a can be reduced within a longer range, thereby preventing color deviation from being generated at a large viewing angle. The second converging lens 62 may be configured as a structure of a semi-cylinder, more than a semi-cylinder, or less than a semi-cylinder.

In some other embodiments of the present disclosure, the micro-lens layer 6 may further include a first plate layer 63 and a second plate layer 64, the first plate layer 63 is provided between the color film layer 4 and the first converging lens 61, the second plate layer 64 is provided between the color film layer 4 and the second converging lens 62, the second plate layer 64 is connected to the first plate layer 63, and the first plate layer 63 and the second plate layer 64 may be formed with the micro-lens layer 6 through a single patterning process. Providing the first flat plate layer 63 and the second flat plate layer 64 may avoid damage to the first planarization layer 3 when the first converging lens 61 and the second converging lens 62 are formed, by which the process operation is facilitated, the process difficulty is reduced, and the efficiency is improved.

Figure 6:
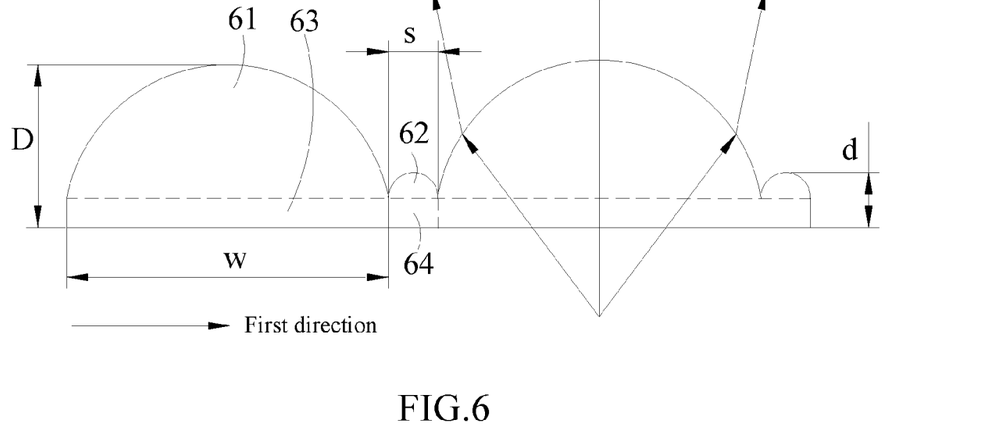
FIG. 6 is a schematic diagram of a size relationship of the micro-lens layer in FIG. 1.

Referring to FIG. 1 and FIG. 6, since the second converging lens 62 is provided between two adjacent first converging lenses 61, and the orthographic projection of the separating line between two adjacent filter portions 4a on the display panel 1 is at least partially located within the orthographic projection of the second converging lens 62 on the display panel 1, w+s=P; where, P is the width of the filter portion 4a in the first direction, which has been determined during design and is a known number; s is the width of the gap 65 in the first direction, that is, the width of the second converging lens 62 in the first direction, which is determined by the limit of the resolution of the first converging lens 61, that is, it is determined by the size of the opening of the photolithography mask (the material of the micro-lens material layer is a positive photoresist, and the photosensitive portion is removed during development), and is a known number; w is the width of the first converging lens 61 in the first direction, and may be calculated according to the foregoing two known numbers.

The optical path L between the light-emitting surface of the display panel 1 and the surface of the micro-lens layer 6 close to the display panel 1 is equal to $\Sigma L_i n_i$, where, $L_i$ is the thickness of each film layer between the light-emitting surface of the display panel 1 and the micro-lens layer, and $n_i$ is the refractive index of each film layer between the light-emitting surface of the display panel 1 and the micro-lens layer.

Since the first converging lens 61 is a hemispheroid, the first converging lens 61 and the second converging lens 62 satisfies a relationship of:

$$D-d=(P-s)/2,$$

where, D is the sum of the height of the first converging lens 61 and the height of the first flat plate layer 63, and d is the sum of the height of the second converging lens 62 and the height of the second flat plate layer 64.

Moreover, the object focal length f of the first converging lens 61 of the hemispheroid is approximately:

$$1/f=2\times(n-1)/(P-s),$$

where, n is the refractive index of the first converging lens 61.

The light-emitting surface of the light-emitting layer 16 is provided on the object focal plane, and then, L=f. Therefore, it can be obtained that the thickness and refractive index of each film layer between the light-emitting surface of the display panel 1 and the micro-lens layer satisfy the relationship of:

$$L=\Sigma L_i n_i \approx (P-s)/[2\times(n-1)],$$

where, L is the optical path between the light-emitting surface of the display panel 1 and the surface of the flat plate layer close to the display panel 1; the width P of the filter portion 4a in the first direction, the width s of the gap 65 in the first direction, and the refractive index n of the first converging lens 61 are all known numbers. Therefore, the thickness and refractive index of each film layer between the light-emitting surface of the display panel 1 and the micro-lens layer can be adjusted through the above formula, so as to satisfy the requirements of the above formula.

In this example embodiment, the display module may further include an adhesive layer 7. The adhesive layer 7 is provided on a side of the micro-lens layer 6 away from the display panel 1, and the material of the adhesive layer 7 may be an optically clear adhesive (OCA).

In this example embodiment, the display module may further include a cover plate 8, and the cover plate 8 is provided on a side of the adhesive layer 7 away from the display panel 1, that is, the cover plate 8 is bonded to the micro-lens layer 6 cover plate 8 through the adhesive layer 7. The cover plate 8 plays a role of protecting the display module.

Referring to FIG. 8, in another example embodiment of the present disclosure, the micro-lens layer 6 is located on a side of the color film layer 4 close to the display panel 1, that is, the micro-lens layer 6 is provided between the color film layer 4 and the display panel 1.

For example, a first planarization layer 3 may be provided on a light-emitting side of the display panel 1, that is, the first planarization layer 3 may be provided on a side of the TFE 2 away from the substrate layer 11; and a micro-lens layer 6 is provided on a side of the first planarization layer 3 away from the display panel 1, and a color film layer 4 is provided on a side of the micro-lens layer 6 away from the display panel 1.

The specific structure of the display panel 1 is described in detail above, and details are not described here again.

Referring to FIG. 8, a first recess portion 31 and a second recess portion 32 are provided on the first planarization layer 3. For example, a first recess portion 31 and a second recess portion 32 are provided on a surface of the first planarization layer 3 facing away from the display panel 1, and a depth of the first recess portion 31 is greater than a depth of the second recess portion 32, and an opening area of the first recess portion 31 is greater than an opening area of the second recess portion 32. A portion of the micro-lens layer 6 provided in the first recessed portion 31 forms a first converging lens 61, and a portion of the micro-lens layer 6 provided outside the first recessed portion 31 forms a first flat plate layer 63. A portion of the micro-lens layer 6 provided in the second recessed portion 32 forms a second converging lens 62, and a portion of the micro-lens layer 6 provided outside the second recessed portion 32 forms the second flat plate layer 64, such that the formed first converging lens 61 and the second converging lens 62 protrude towards the side close to the display panel 1.

Moreover, a bottom surface of the first converging lens 61 protrudes from a bottom surface of the second converging lens 62, so that a groove 66 is formed between two adjacent first converging lenses 61. The bottom surface of the second converging lens 62 is a groove bottom wall of the groove 66, and at least part of the overlapping portion 44 is located within the groove 66. Therefore, on a section perpendicular to the display panel 1, the orthographic projection of the lowest point of the overlapping portion 44 close to the display panel 1 on the display panel 1 is located within the orthographic projection of the second converging lens 62 on the display panel 1. The lowest point of the overlapping portion 44 close to the display panel 1 is generally located in the middle of the overlapping portion 44, so that the second converging lens 62 is substantially located in the middle of the overlapping portion 44. The second converging lens 62 has substantially the same refractive effect on the light emitted from the two adjacent filter portions 4a, and there will not be a larger refractive angle for one and a smaller refractive angle for the other, thereby avoiding poor color deviation.

Figure 9:
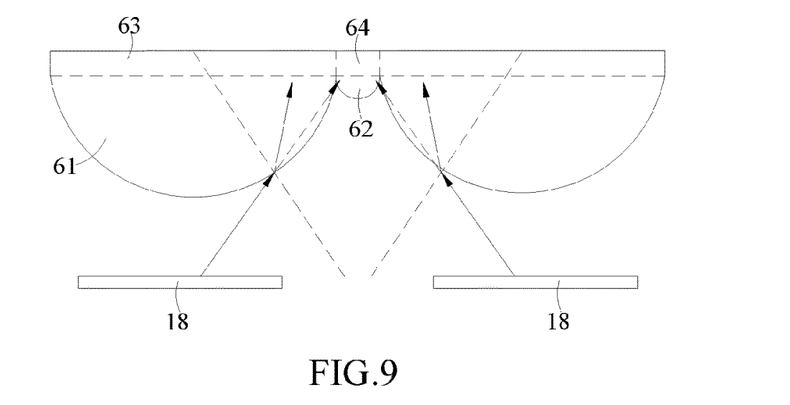
FIG. 9 is a schematic diagram of the optical paths of the micro-lens layer in FIG. 7 and FIG. 8.

The refractive index of the first planarization layer 3 is less than the refractive index of the micro-lens layer 6. As shown in FIG. 9, the first converging lens 61 and the second converging lens 62 can refract the light with a relatively larger inclination angle incident to the interface between the first planarization layer 3 and the micro-lens layer 6 layer, and the refractive angle is less than the incident angle, so that the light with a relatively larger inclination angle is converged, and the front light-emitting efficiency of the display module is improved.

Moreover, the micro-lens layer 6 is provided on the side of the color film layer 4 close to the display panel 1, so that the light emitted by the display panel 1 firstly passes through the micro-lens layer 6 and then passes through the color film layer 4. After being converged firstly by the micro-lens layer 6, the light incident to the overlapping portion 44 is reduced, and the light incident to the non-overlapping portion is increased, thereby further improving the light-emitting efficiency of the display module.

In addition, the relative relationship between the first converging lens 61 and the second converging lens 62 and each film layer in the display panel 1 in FIG. 7 and FIG. 8 can be the same as the relative relationship between the first converging lens 61 and the second converging lens 62 and each film layer in the display panel 1 in FIG. 1, and therefore, details are not described here again.

Figure 10:
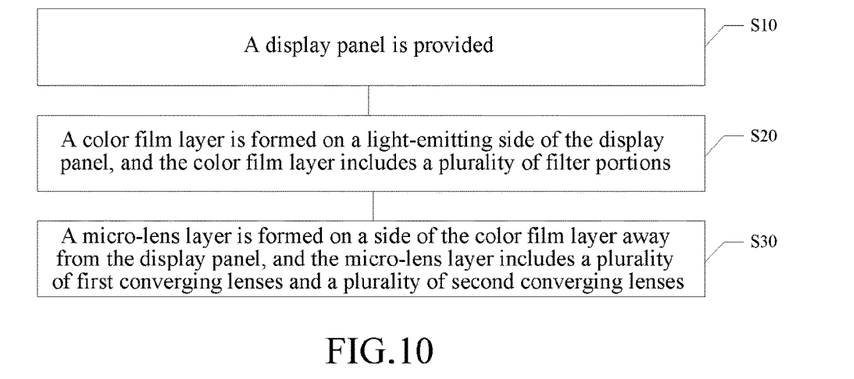
FIG. 10 is a schematic flowchart of a method for preparing a display module according to some embodiments of the present disclosure.

Based on the same inventive concept, example embodiments of the present disclosure provide a method for preparing a display module. Referring to the flowchart of the method for preparing the display module of the present disclosure as shown in FIG. 10, the method for preparing the display module may include the following steps.

In step S10, a display panel 1 is provided.

In step S20, a color film layer 4 is formed on a light-emitting side of the display panel 1, and the color film layer 4 includes a plurality of filter portions 4a.

In step S30, a micro-lens layer 6 is formed on a side of the color film layer 4 away from the display panel 1, and the micro-lens layer 6 includes a plurality of first converging lenses 61 and a plurality of second converging lenses 62.

Among them, a gap 65 is provided between two adjacent first converging lenses 61, and an orthographic projection of a first converging lenses 61 on the display panel 1 is located within an orthographic projection of a filter portion 4a on the display panel 1. The second converging lens 62 is provided in the gap 65 between two adjacent first converging lenses 61, and the second converging lens 62 is connected to the first converging lens 61.

Various steps of the method for preparing the display module are described in detail below.

The method for preparing the display panel 1 adopts the current preparing method at present, and therefore, details are not described here again.

The first planarization layer 3 is formed on the light-emitting side of the display panel 1 through a method of deposition, coating, and the like.

Firstly, a red filter material layer is formed on the side of the first planarization layer 3 away from the display panel 1 through the method of deposition, coating, and the like; and then, the red filter material layer is subjected to photolithography to form the red filter portion 41.

Next, a green filter material layer is formed on the side of the first planarization layer 3 away from the display panel 1 through the method of deposition, coating, and the like; and then, the green filter material layer is subjected to photolithography to form the green filter portion 42.

Again, the blue filter material layer is formed on the side of the first planarization layer 3 away from the display panel 1 through the method of deposition, coating, and the like; and then, the blue filter material layer is subjected to photolithography to form the blue filter portion 43.

It should be noted that the order of forming the red filter portion 41, the green filter portion 42, and the blue filter portion 43 may be changed as needed.

Since the red filter material, the green filter material and the blue filter material are all negative photoresist, there will be a certain expansion during development, so that there is a certain overlap between the filter portions 4a of different colors. The height of the overlapping portion is higher than the height of the non-overlapping portion, so that the surface of the color film layer 4 is uneven.

A second planarization layer 5 is formed on a side of the color film layer 4 away from the display panel 1 through the method of deposition, coating, and the like. The second planarization layer 5 may provide a relatively flatter base surface for the subsequently formed micro-lens layer.

The micro-lens material layer is formed on a side of the second planarization layer 5 away from the display panel 1 through the method of deposition, coating, and the like. The material of the micro-lens material layer is an organic resin, and the thickness of the micro-lens material layer is D1 (where, D is greater than D1, and the difference between D and D1 is about 0.1 μm to 0.2 μm). Then, the micro-lens material layer is subjected to photolithography to form a preset pattern layer. However, the exposure time or the light intensity during exposure is reduced, so that the micro-lens material layer retains a layer having a thickness of d1 (where, d is greater than d1, and a difference between d and d1 is about 0.05 μm to 0.15 μm), that is, the preset pattern layer includes a flat plate layer and a protruding portion, and the protruding portion is formed on a side of the flat plate layer away from the display panel 1. Secondly, baking is performed. The baking time is greater than or equal to 50 minutes and less than or equal to 70 minutes, for example, the baking time may be 60 minutes. The baking temperature is greater than or equal to 100° C. and less than or equal to 130° C., for example, the baking temperature may be 115° C. Finally, natural cooling is performed. During baking, the micro-lens material layer may expand to a certain extent, so that the protruding portion forms the first converging lens 61, and the gap between the two first converging lenses 61 is smaller. The flat plate layer in the gap is not prone to diffusing to form the second converging lens 62 during baking and expanding, and the flat plate layers at other positions are prone to diffusing during baking and expanding, without forming the second converging lens 62.

It should be noted that, although the steps of the method for preparing the display module in the present disclosure are described in a specific order in the drawings, this does not require or imply that these steps must be performed in this specific order, or that all the illustrated steps must be performed to achieve the desired results. Additionally or alternatively, some steps may be omitted, a plurality of steps may be combined into one step for execution, and/or one step may be decomposed into a plurality of steps for execution, etc.

Based on the same inventive concept, example embodiments of the present disclosure provide a display device, which may include any of the display modules described above, and the specific structure of the display module has been described in detail above, and therefore, details are not described here again.

The specific type of the display device is not particularly limited, and all common display device types used in the art may be acceptable, for example, a mobile device such as a mobile phone, a wearable device such as a watch, an AR (Augmented Reality)/VR (Virtual Reality) device, etc. Those skilled in the art may correspondingly select according to the specific use of the display device, which will not be repeated here. Especially with the maturation of AR/VR technology and increasing attention from the consumer market and preparing industry, and the market share of AR/VR in 2025 is expected to exceed 1,000 billion dollars.

It should be noted that, in addition to the display panel 1, the display device further includes other necessary components and compositions. Taking the display as an example, such as a housing, a circuit board, a power line, and the like, those skilled in the art may correspondingly supplement according to the specific use requirements of the display device, and details are not described here again.

Compared with the related art, the beneficial effects of the display device provided by the embodiments of the present disclosure are the same as the beneficial effects of the display modules provided by the above example embodiments, and details are not described here.

Other embodiments of the present disclosure will be apparent to those skilled in the art from consideration of the specification and practice of the disclosure disclosed herein. The present disclosure is intended to cover any variations, uses, or adaptations of the present disclosure following the general principles of the present disclosure and including common general knowledge or conventional technical means in the art not disclosed in the present disclosure. The description and embodiments are only considered exemplary, and the true scope and spirit of the present disclosure are indicated by the accompanying claims.

What is claimed is:

1. A display module, comprising:
   a display panel; and a color film layer and a micro-lens layer, provided on a light-emitting side of the display panel; wherein, the color film layer comprises a plurality of filter portions, and the micro-lens layer comprises a plurality of first converging lenses and a plurality of second converging lenses; a gap is provided between two adjacent first converging lenses, and an orthographic projection of a first converging lens on the display panel is located within an orthographic projection of a filter portion on the display panel; a second converging lens is provided in the gap between two adjacent first converging lenses, and a vertex of the second converging lens is located between a vertex of the first converging lens and a bottom surface of the first converging lens.

2. The display module according to claim 1, wherein an overlapping portion is provided between two adjacent filter portions, and an orthographic projection of the overlapping portion on the display panel overlaps with an orthographic projection of the second converging lens on the display panel.

3. The display module according to claim 2, wherein the first converging lens and the second converging lens protrude towards a side close to the display panel.

4. The display module according to claim 3, wherein the display module further comprises:
a first planarization layer, provided between the display panel and the micro-lens layer;
wherein, a refractive index of the first planarization layer is less than a refractive index of the micro-lens layer, a first recessed portion and a second recessed portion are provided on the first planarization layer, a portion of the micro-lens layer provided in the first recessed portion forms the first converging lens, and a portion of the micro-lens layer provided in the second recessed portion forms the second converging lens.

5. The display module according to claim 4, wherein the bottom surface of the first converging lens protrudes from a bottom surface of the second converging lens, so that a groove is formed between two adjacent first converging lenses, and at least part of the overlapping portion is located within the groove.

6. The display module according to claim 3, wherein, on a section perpendicular to the display panel, an orthographic projection of a lowest point of the overlapping portion close to the display panel on the display panel is located within an orthographic projection of the second converging lens on the display panel.

7. The display module according to claim 2, wherein the first converging lens and the second converging lens protrude towards a side away from the display panel.

8. The display module according to claim 7, wherein, on a section perpendicular to the display panel, an orthographic projection of a highest point of the overlapping portion away from the display panel on the display panel is located within an orthographic projection of the second converging lens on the display panel.

9. The display module according to claim 7, wherein the micro-lens layer further comprises:
a first flat plate layer, provided on a side of the first converging lens close to the display panel; and
a second flat plate layer, provided on a side of the second converging lens close to the display panel, the second flat plate layer being integrally connected to the first flat plate layer.

10. The display module according to claim 9, wherein the first converging lens and the second converging lens satisfies a relationship of:

$$D-d=(P-s)/2,$$

wherein, P is a width of the filter portion in a first direction, s is a width of the gap in the first direction, D is a sum of a height of the first converging lens and a height of the first flat plate layer, and d is a sum of a height of the second converging lens and a height of the second flat plate layer.

11. The display module according to claim 10, wherein a thickness and a refractive index of each film layer between a light-emitting surface of the display panel and the micro-lens layer satisfy a relationship of:

$$L=\Sigma L_i n_i \approx (P-s)/[2\times(n-1)],$$

wherein, L is an optical path between the light-emitting surface of the display panel and a surface of the micro-lens layer close to the display panel, n is a refractive index of the first converging lens, Li is the thickness of each film layer between the light-emitting surface of the display panel and the micro-lens layer, and $n_i$ is the refractive index of each film layer between the light-emitting surface of the display panel and the micro-lens layer.

12. The display module according to claim 1, wherein a width of the second converging lens is less than 1/10 of a width of the first converging lens, and a height of the second converging lens is less than 1/10 of a height of the first converging lens.

13. The display module according to claim 1, wherein the display panel comprises:
a substrate layer;
a first electrode, provided between the substrate layer and the color film layer;
a light-emitting layer, provided on a side of the first electrode away from the substrate layer; and
a second electrode, provided on a side of the light-emitting layer away from the substrate layer;
wherein, an orthographic projection of the second converging lens on the substrate layer is at least partially located within a projection of an edge portion of the first electrode on the substrate layer.

14. The display module according to claim 13, wherein the second electrode comprises a flat portion and a concave portion, and the orthographic projection of the second converging lens on the substrate layer is located within a projection of the concave portion on the substrate layer.

15. The display module according to claim 13, wherein a width of the first converging lens is greater than a maximum width of the first electrode.

16. The display module according to claim 13, wherein a height of the second converging lens is less than a distance between two adjacent first electrodes.

17. The display module according to claim 13, wherein an orthographic projection of the first converging lens on the substrate layer is located within an orthographic projection of the light-emitting layer on the substrate layer.

18. The display module according to claim 1, wherein the first converging lens is configured as a spherical segment structure, and the second converging lens is configured as a spherical segment structure.

19. The display module according to claim 1, wherein the micro-lens layer is located on a side of the color film layer away from the display panel, or the micro-lens layer is located on a side of the color film layer close to the display panel.

20. A display device, comprising a display module, wherein the display module comprises:
a display panel;

a color film layer and a micro-lens layer, provided on a light-emitting side of the display panel; wherein, the color film layer comprises a plurality of filter portions, and the micro-lens layer comprises a plurality of first converging lenses and a plurality of second converging lenses; a gap is provided between two adjacent first converging lenses, and an orthographic projection of a first converging lens on the display panel is located within an orthographic projection of a filter portion on the display panel; a second converging lens is provided in the gap between two adjacent first converging lenses, and a vertex of the second converging lens is located between a vertex of the first converging lens and a bottom surface of the first converging lens.

* * * * *